United States Patent
Ivanov et al.

(10) Patent No.: US 6,703,900 B2
(45) Date of Patent: Mar. 9, 2004

(54) FAST, STABLE OVERLOAD RECOVERY CIRCUIT AND METHOD

(75) Inventors: Vadim V. Ivanov, Tucson, AZ (US); Shilong Zhang, Tucson, AZ (US); Gregory H. Johnson, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 36 days.

(21) Appl. No.: 10/163,113

(22) Filed: Jun. 5, 2002

(65) Prior Publication Data

US 2003/0227328 A1 Dec. 11, 2003

(51) Int. Cl.[7] .................................................. H03F 1/52
(52) U.S. Cl. ........................ 330/255; 330/264; 330/267
(58) Field of Search ................................. 330/255, 264, 330/267

(56) References Cited

U.S. PATENT DOCUMENTS

| | | | |
|---|---|---|---|
| 4,241,313 A | 12/1980 | Takehara | 330/253 |
| 4,352,073 A | 9/1982 | Leuthold | 330/264 |
| 4,622,521 A | 11/1986 | Redfern | 330/9 |
| 4,714,896 A | 12/1987 | Addis | 330/261 |
| 5,059,922 A | 10/1991 | Mahabadi | 330/264 |
| 5,204,636 A | 4/1993 | Werner, Jr. et al. | 330/85 |
| 5,311,145 A | 5/1994 | Huijsing et al. | 330/255 |
| 5,374,857 A | 12/1994 | Carobolante | 327/110 |
| 5,426,383 A | 6/1995 | Kumar | 326/119 |
| 5,442,319 A | 8/1995 | Seesink et al. | 330/253 |
| 5,546,045 A | 8/1996 | Sauer | 327/561 |
| 5,699,015 A | 12/1997 | Dotson et al. | 330/255 |
| 5,864,245 A | 1/1999 | Watarai | 326/81 |
| 5,917,378 A | 6/1999 | Juang | 330/253 |
| 6,037,826 A | 3/2000 | Poletto et al. | 327/375 |
| 6,150,883 A | 11/2000 | Ivanov | 330/253 |
| 6,317,000 B1 | 11/2001 | Ivanov et al. | 330/255 |
| 6,509,797 B2 * | 1/2003 | Nolan | 330/255 |

FOREIGN PATENT DOCUMENTS

| | | | |
|---|---|---|---|
| JP | 0025655 | 2/1979 | 330/253 |
| JP | 354018264 A  * | 2/1979 | |
| JP | 0053910 | 4/1980 | 330/267 |
| JP | 0219207 | 9/1986 | 330/253 |
| JP | 404045603 | 2/1992 | 330/253 |

OTHER PUBLICATIONS

Lim et al. "A 8–bit 200 mhz B; CMOS comparator" IEEE Journal of Solid State Circuits vol. 25, Issue 1 , Feb. 1990 pp. 192–199.*

* cited by examiner

*Primary Examiner*—Michael B Shingleton
(74) *Attorney, Agent, or Firm*—W. Daniel Swayze, Jr.; W. James Brady; Frederick J. Telecky, Jr.

(57) ABSTRACT

A differential amplifier includes an input stage (13) and an output stage (100) including an output transistor (M11) having a source coupled to a supply voltage ($V_{DD}$), a gate coupled to a terminal (14) of the input stage, and a drain coupled to an output conductor (22). A recovery circuit (1A) is coupled between the supply voltage and the gate of the output transistor for limiting the voltage on the gate of the output transistor in response to the output voltage be within a predetermined range of the supply voltage and includes a recovery transistor (M4) with a source coupled to the output conductor and a drain coupled to the gate of the output transistor and a common-gate amplifier (29A) having a built-in offset a first input coupled to the output conductor, a second input coupled to the supply voltage, and an output coupled to the gate of the recovery transistor.

24 Claims, 4 Drawing Sheets

FAST, STABLE OVERLOAD RECOVERY CIRCUIT AND METHOD

BACKGROUND OF THE INVENTION

The invention relates to high-speed CMOS operational amplifiers, and also to circuitry that reduces the amount of delay required for a high-speed CMOS operational amplifier to recover from a saturation condition.

U.S. Pat. Nos. 5,546,045, 4,622,521 and 4,714,896 disclose prior recovery circuits. U.S. Pat. No. 5,546,045 discloses a rail-to-rail bipolar class AB output stage.

It should be appreciated that until now, there have been very few commercially available high-speed CMOS operational amplifiers. This is because until very recently CMOS transistors that could be readily manufactured using reasonably low-cost CMOS integrated circuit manufacturing processes have had minimum channel length values that are not short enough (i.e., not less than about 0.7 microns) to allow CMOS operational amplifiers manufactured with such CMOS integrated circuit manufacturing processes to compete effectively with high-speed bipolar operational amplifiers manufactured using standard bipolar integrated circuit manufacturing processes. This is because the longer minimum channel lengths of the prior CMOS manufacturing processes result in large gate capacitances of all of the transistors, especially the pull-up transistors and pull-down transistors of the amplifier output stages. The large gate capacitances result in reduced circuit operating speeds compared to what has been achievable using conventional bipolar integrated circuit manufacturing processes. It is possible for operational amplifiers made with a typical CMOS manufacturing process to have operating speeds comparable to those of conventional bipolar integrated circuit operational amplifiers only if the minimum channel lengths for transistors made using that CMOS manufacturing process are sufficiently small (e.g., less than approximately 0.6 microns for a circuit designed for use with low power supply voltages, or as much as approximately 2.0 microns for a circuit designed for use with high power supply voltages).

In prior art CMOS operational amplifiers, if the output voltage responds to the input signal by increasing to a level close to the positive supply voltage, the input stage of the operational amplifier, which typically includes a differential input stage and a folded cascode stage that is connected to the gate of the P-channel pull-up transistor, causes the gate of the P-channel pull-up transistor to be pulled down to a level near the ground or negative supply voltage level in order to adequately turn on the P-channel pull-up transistor. Typically, there is a large capacitance coupled to the conductor connected to the gate of the P-channel pull-up transistor.

The large capacitance typically includes the gate capacitance of the pull-up transistor and the capacitance of the compensation capacitor of the operational amplifier. Consequently, if the input signal applied to the operational amplifier is rapidly decreased, the input stage of the operational amplifier needs to charge the gate voltage of the P-channel pull-up transistor to a high voltage nearly equal to the positive supply voltage before the P-channel pull-up transistor is turned off. The current supplied by the input stage of the operational amplifier to accomplish the charging up of the large capacitance coupled to and associated with the gate of the P-channel pull-up transistor is small, typically about 100 microamperes. Consequently, there is a substantial delay, referred to herein as an overload recovery delay, before the operational amplifier output voltage responds to the change in the input signal. The foregoing problem for the P-channel pull-up transistor is accompanied by an analogous overload recovery delay problem for the N-channel pull down transistor. The above described overload recovery delay problems have made CMOS operational amplifiers unsuitable for certain applications. The above described problems for CMOS operational amplifiers also apply directly to CMOS comparators and some other kinds of amplifiers.

For a long time there has been a need for an inexpensive, high-speed integrated circuit operational amplifier with rapid recovery from a saturation or overload condition. This need has not been satisfied by prior CMOS operational amplifiers. Similarly, the need for an inexpensive, high-speed integrated circuit comparator with rapid recovery from a saturation or overload condition has not been satisfied by prior CMOS comparators.

Commonly assigned U.S. Pat. No. 6,317,000 by the present inventors, issued Nov. 13, 2001 is incorporated herein by reference. U.S. Pat. No. 6,317,000 is directed to overcoming the foregoing problem of the prior art. However, the circuitry disclosed therein is slow and therefore unstable, and consequently more compensation capacitance than desirable is required to achieve stable operation. Therefore, the previous need for an inexpensive, high-speed integrated circuit amplifier, operational amplifier, comparator or the like has not been fully satisfied by the circuitry disclosed in our U.S. Pat. No. 6,317,000.

SUMMARY OF THE INVENTION

Accordingly, it is an object of the invention to provide an inexpensive, high-speed, stable CMOS amplifier having rapid recovery from a saturation or overload condition.

It is another object of the invention to provide an inexpensive, high-speed, stable CMOS differential amplifier having rapid recovery from a saturation or overload condition.

It is another object of the invention to provide an inexpensive, high-speed, stable CMOS comparator having rapid recovery from a saturation or overload condition.

It is another object of the invention to provide an inexpensive, high-speed, stable CMOS differential amplifier which limits current supplied to a portion of the amplifier circuit, for example, a portion of a slew boost circuit in the differential amplifier circuit, during the same conditions wherein an output transistor of the differential amplifier is saturated.

It is another object of the invention to provide an inexpensive, high-speed, stable integrated circuit CMOS operational amplifier which competes effectively in the marketplace with bipolar integrated circuit operational amplifiers.

It is another object of the invention to provide an inexpensive, high-speed, stable integrated circuit CMOS comparator which competes effectively in the marketplace with bipolar integrated circuit comparators.

It is another object of the invention to provide an inexpensive, higher-speed, more stable integrated circuit CMOS amplifier, operational amplifier, or comparator having a simpler circuit configuration than those described in U.S. Pat. No. 6,317,000.

Briefly described, and in accordance with one embodiment thereof, the invention provides a difference amplifier that includes an input stage having an output terminal (14), an output stage (100) including an output transistor (M11) having a source coupled to a supply voltage ($V_{DD}$), a gate coupled to the output terminal (14), and a drain coupled to an output conductor (22). An overload recovery circuit (1A) is coupled between the output conductor and the gate of the output transistor for limiting the voltage on the gate of the output transistor in response to the output voltage when the output voltage is within a predetermined range of the supply voltage. The overload recovery circuit includes a recovery transistor (M4) having a source coupled to the output conductor in one embodiment and to the supply voltage in another embodiment and a drain coupled to the gate of the output transistor. The overload recovery circuit includes an amplifier (29A) with a built-in offset having a first input coupled to the output conductor, a second input coupled to the supply voltage, and an output coupled to the gate of the recovery transistor.

DETAILED DESCRIPTION OF THE PREFERRED EMBODIMENTS

Figure 3:
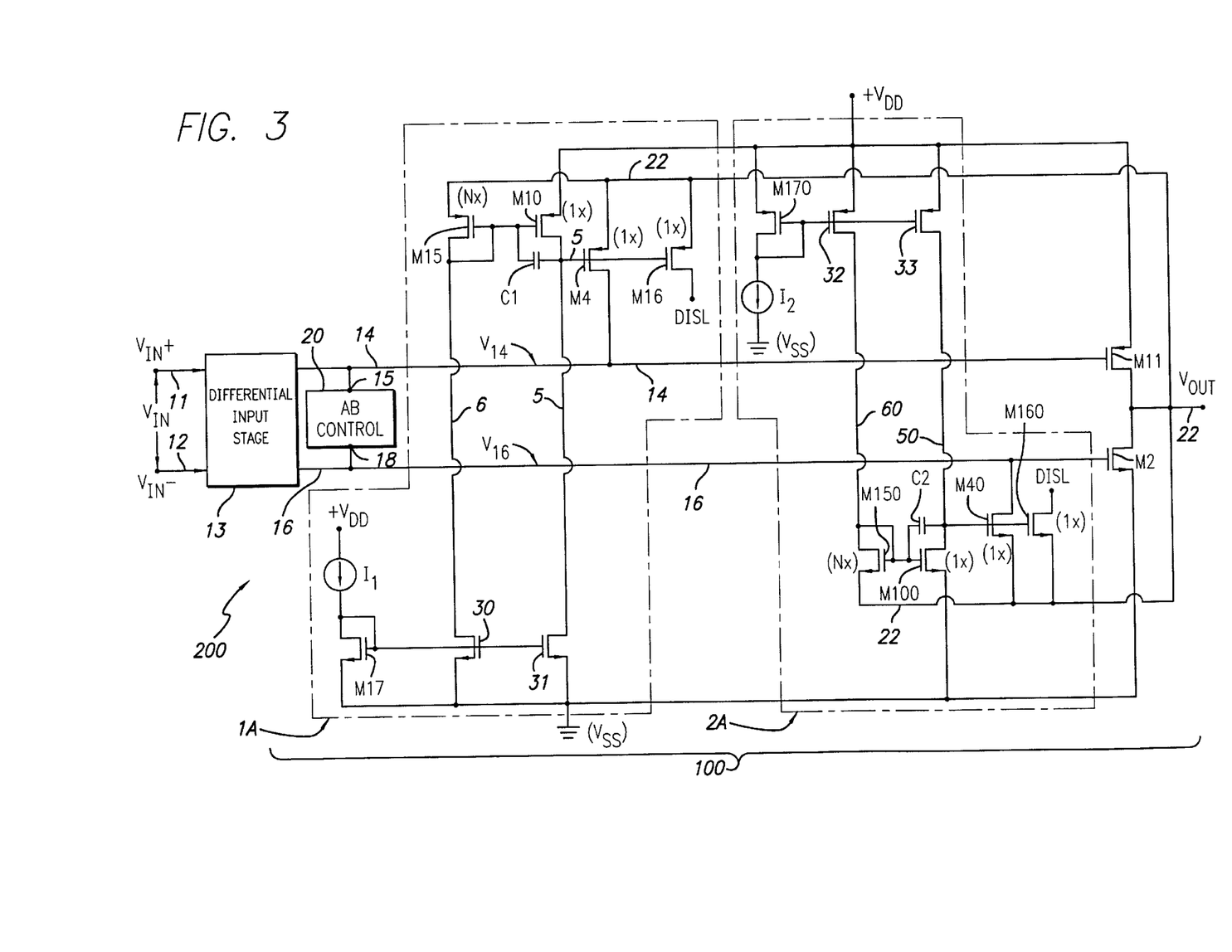
FIG. 3 is a schematic diagram a preferred embodiment of an amplifier including the invention for providing rapid overload recovery from saturation against either the $+V_{DD}$ supply voltage rail or a ground or the negative ($-V_{SS}$) supply voltage rail.

Referring to first to FIG. 3, an operational amplifier 200 includes a differential input stage 13 which receives an input signal $V_{in}^+$ on an input conductor 11 and also receives an input signal $V_{in}^-$ on an input conductor 12, so that a differential input voltage $V_{in}$ equal to $V_{in}^+$ minus $V_{in}^-$ is applied to differential input stage 13. In response, differential input stage 13 produces output signals on conductors 14 and 16, which are the inputs of an output stage 100.

Output stage 100 includes a conventional class AB control circuit 20 including a first terminal 15 connected to conductor 14 and a second terminal 18 connected to conductor 16. (Typically, the terminals of a class AB control circuit are input/output terminals.) Class AB control circuit 20 can be similar to one disclosed in U.S. Pat. No. 5,311,145 by Huijsing et al.

Output stage 100 also includes a P-channel pull-up transistor M11 and an N-channel pull-down transistor M2. Pull-up transistor M11 has its source connected to $+V_{DD}$ (typically about +5 volts), its gate connected to conductor 14, and its drain connected to an output conductor 22 on which an output voltage $V_{out}$ is produced. The signal $V_{14}$ produced on conductor 14 by differential input stage 13 thus is a "pull-up transistor control signal" that needs to be limited in accordance with the present invention to prevent long overload recovery times. Pull-down transistor M2 has a source connected to a ground or $V_{SS}$ supply voltage, a gate connected to conductor 16, and a drain connected to output conductor 22. The signal $V_{16}$ produced on conductor 16 by differential input stage 13 thus is a "pull-down transistor control signal" that also needs to be limited in accordance with the present invention to prevent long overload recovery times.

Output stage 100 also includes a "high side" overload recovery circuit 1A connected to conductor 14 to limit how low the pull-up transistor control signal $V_{14}$ goes as $V_{out}$ is "pulled up" by pull-up transistor M11, so as to reduce the overload recovery time. Similarly, output stage 100 includes a "low side" overload recovery circuit 2A connected to conductor 16 to limit how high the pull-down transistor control signal $V_{16}$ goes as $V_{out}$ is "pulled down" by pull-down transistor M2, so as to reduce the overload recovery time. High side overload recovery circuit 1A and low side overload recovery circuit 2A are shown in FIGS. 2A and 2B, respectively, and will be described later after FIGS. 1A and 1B are described.

Figure 1A:
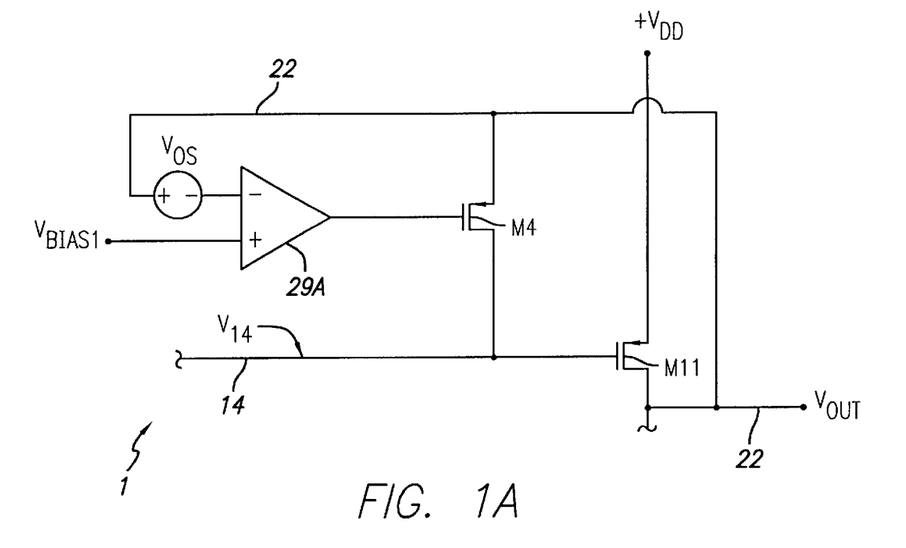
FIG. 1A is a generalized diagram of a recovery circuit of the invention for reducing overload recovery time of a pull-up transistor of amplifier.

Referring next to FIG. 1A, high side recovery circuit 1 includes a P-channel pull-up recovery transistor M4 having its drain connected to pull-up control signal conductor 14 of FIG. 3. The source of pull-up recovery transistor M4 is connected to $V_{out}$ by conductor 22. The gate of pull-up recovery transistor M4 is connected to the output of a pull-up recovery amplifier 29A. The (+) input of pull-up recovery amplifier 29A is connected to receive a bias voltage $V_{BIAS1}$. The (-) input of pull-up recovery amplifier 29A is connected to output conductor 22 of FIG. 3. The voltage source Vos is shown between $V_{out}$ and the (-) input of pull-up recovery amplifier 29A to represent the inherent input offset voltage of pull-up recovery amplifier 29A. In accordance with the present invention, pull-up recovery amplifier 29A has a "built-in" offset the magnitude of which exceeds the magnitude of Vos. For the typical CMOS integrated circuit, it can be expected that the value of Vos is as much as roughly 10 millivolts, and the built-in offset voltage should be somewhere between slightly more than 10 millivolts and roughly 50 millivolts.

Figure 1B:
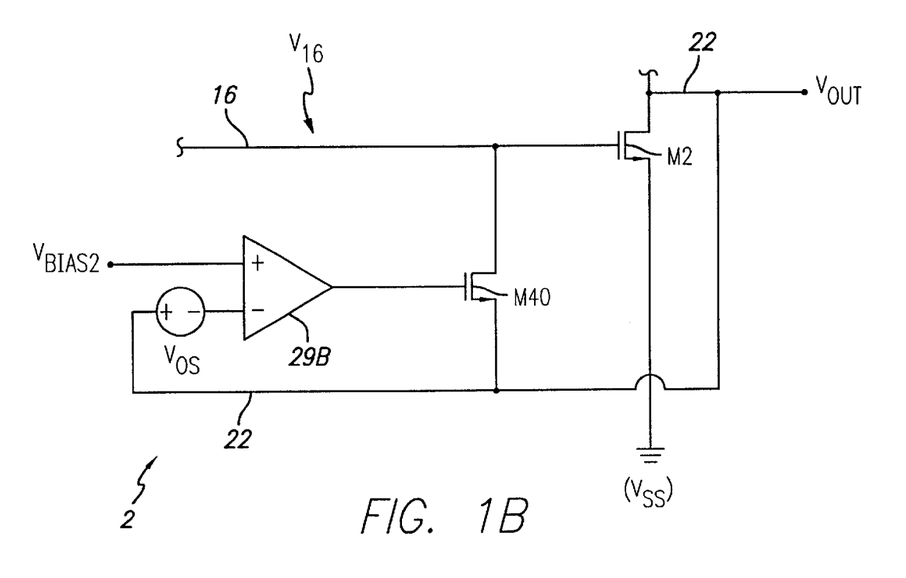
FIG. 1B is a generalized diagram of a recovery circuit of the invention for reducing overload recovery time of a pull-down transistor of amplifier.

FIG. 1B shows a low side recovery circuit 2 including an N-channel pull-down recovery transistor M40 having its drain connected to pull-down control signal conductor 16 of FIG. 3. The source of pull-down recovery transistor M40 is connected to $V_{out}$ by conductor 22. The gate of pull-down recovery transistor M40 is connected to the output of a pull-down recovery amplifier 29B. The (+) input of pull-down recovery amplifier 29B is connected to receive a bias voltage $V_{BIAS2}$. The (-) input of pull-up recovery amplifier 29A is connected to output conductor 22 of FIG. 3. As in FIG. 1A, voltage source Vos is shown between $V_{out}$ and the (-) input of pull-up recovery amplifier 29B to represent the inherent input offset voltage of pull-up recovery amplifier 29B. As in FIG. 1A, pull-down recovery amplifier 29B has a "built-in" offset the magnitude of which exceeds the magnitude of Vos.

Figure 2A:
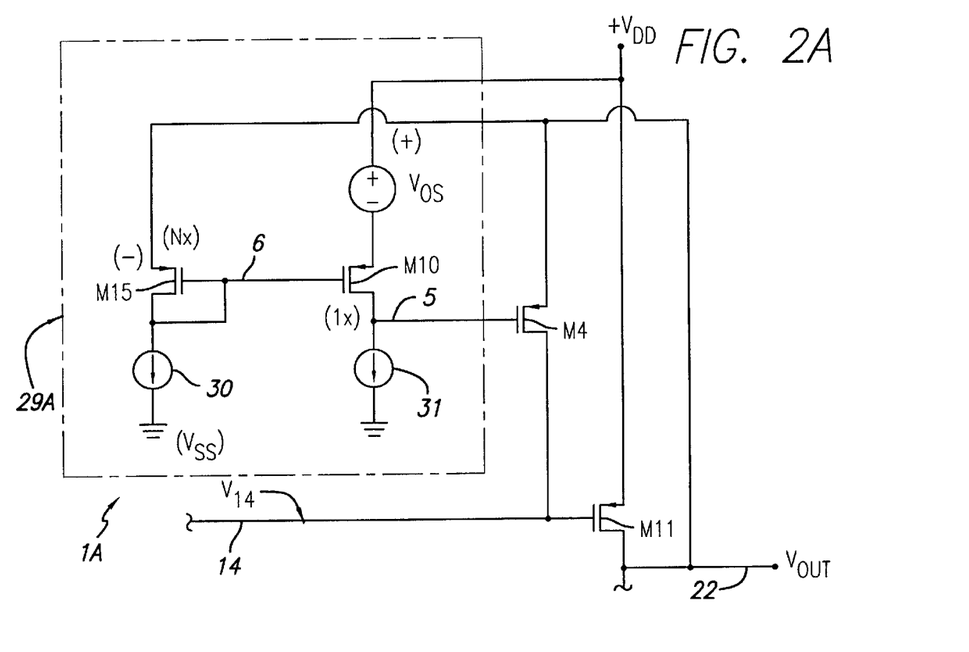
FIG. 2A is a schematic diagram of an implementation of the amplifier 29A in FIG. 1A.
Figure 2B:
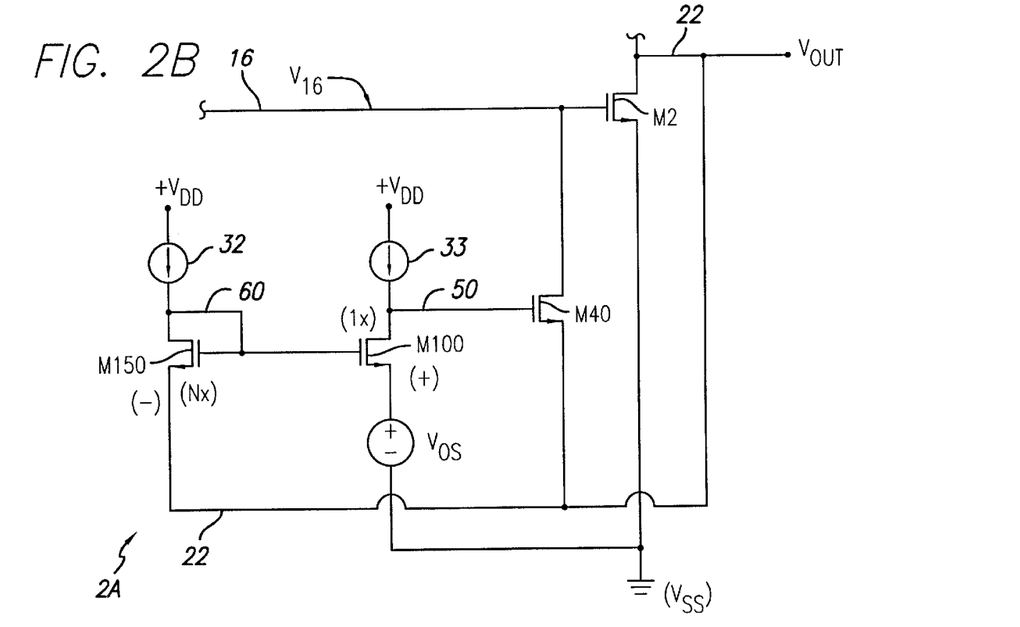
FIG. 2B is a schematic diagram of an implementation of the amplifier 29B in FIG. 1A.

FIG. 2A shows a high side recovery circuit 1A which, in accordance with the present invention, is a more specific implementation of the high side recovery circuit I shown in FIG. 1A. Specifically, pull-up recovery amplifier 29A includes two P-channel input transistors M15 and M10 connected in a common-gate configuration, with the source of input transistor M15 being the (-) input and the source of input transistor M10 being the (+) input of pull-up recovery amplifier 29A. As explained above, a voltage source Vos is shown connected between the source of input transistor M10 and $V_{DD}$ to represent a maximum expected value of the inherent input offset voltage of pull-up recovery amplifier 29A, and pull-up recovery amplifier 29A includes a "designed-in" input offset voltage that exceeds Vos. The gate and drain of input transistor M15 are connected by conductor 6 to a current source 30. The drain of input transistor M10 is connected by conductor 5 to a current source 31. Conductor 5 is the output of pull-up recovery amplifier 29A and is connected to the gate of pull-up recovery transistor M4.

The "built-in" offset voltage can be "designed in" by providing input transistor M15 with a channel-width-to-channel-length ratio that is N times larger than that of input transistor M10 (where N is a number having a value from slightly greater than 1 up to roughly 10). The "built-in" offset voltage also can be designed in by designing current sources 30 and 31 so that the current of current source 30 exceeds the current of current source 31. Or, a combination of two the "geometry ratio" technique and the "current ratio" technique can be used. Furthermore, the built-in offset voltage Vos can also be provided by inserting a resistance in series with the source of input transistor M10.

In operation, when $V_{14}$ is being driven low to turn on pull-up transistor M11, $V_{out}$ is initially at a low level, well below $V_{DD}$. This causes the voltage on conductor 6 to be even lower than $V_{out}$ by an amount equal to the $V_{GS}$ voltage of input transistor M15. This keeps input transistor M10 turned on, causing the voltage on conductor 5 to be close to $V_{DDV}$, and thereby keeping pull-up recovery transistor M4 off. $V_{out}$ therefore rapidly rises toward $V_{DD}$ as $V_{14}$ continues to decrease. However, by the time $V_{out}$ has risen to within Vos millivolts of $V_{DDV}$, the voltage on conductor 6 has increased enough to substantially reduce the current flowing through input transistor M10. By the time $V_{out}$ has increased to within Vos millivolts of $V_{DDV}$, the current through current source 31 has lowered the voltage on conductor 5 enough to begin to turn pull-up recovery transistor M4 on, and as it is turned on even harder it prevents $V_{14}$ from going any lower and prevents further "saturation" of pull-up transistor M11, and therefore substantially reduces the overload recovery delay time required to re-charge the large capacitance associated with conductor 14 to a voltage high enough to turn off the pull-up transistor M11, in the event of a sudden decrease in the input signal $V_{in}$ applied to differential input stage 13. Since pull-up recovery transistor M4 is completely off until $V_{out}$ has increased to within Vos millivolts of $V_{DD}$, it does not reduce the open-loop gain of operational amplifier 200 of FIG. 3 until $V_{out}$ has increased to within Vos millivolts of $V_{DD}$.

An important difference between the pull-up overload recovery amplifier 29A of FIG. 2A and the pull-up overload recovery amplifier 1A in FIG. 4 of U.S. Pat. No. 6,317,000 is that in pull-up overload recovery amplifier 29A, the channel-width-to-channel-length ratio of the input transistor M15 (and/or the ratio of the current of current source 30 to the current of current source 31) is substantially greater than that of input transistor M10, as previously explained, in effect producing the "designed-in" input offset voltage that exceeds the inherent input offset voltage. Also, the drain of input transistor M15 is connected to the common gate connection 6, which allows a very short gain path to be provided in pull-up recovery amplifier 29A. Another important difference between the pull-up overload recovery amplifier 29A of FIG. 2A and the pull-up overload recovery amplifier 1A in FIG. 4 of U.S. Pat. No. 6,317,000 is that the latter utilizes a current mirror load circuit connected to the drain of two P-channel input transistors, whereas pull-up overload recovery amplifier 29A utilizes two separate current sources 30 and 31. Consequently, the gain path of pull-up recovery amplifier 29A is very short, extending from the source of input transistor M15 through conductor 6 directly to the drain of input transistor M10 and the gate of pull-up recovery transistor M4. In contrast, in pull-up recovery circuit 1A in FIG. 4 of U.S. Pat. No. 6,317,000, the gain path runs from the source of an input transistor having its source connected to $V_{out}$ through the channel and drain of that input transistor, through both transistors of the current mirror load circuit, to the gate of pull-up recovery transistor M4. This also adds an undesirable inversion in the gain path.

As a result of the foregoing important differences, the present invention provides a much more stable, more easily designed, and faster overload recovery circuit than the circuitry disclosed in our U.S. Pat. No. 6,317,000.

FIG. 2B shows a similar low side recovery circuit 1B which is a more specific implementation of the low side recovery circuit 1 shown in FIG. 1A. In FIG. 2B, pull-down recovery amplifier 29B includes two N-channel input transistors M150 and M100 connected in a common-gate configuration, with the source of input transistor M150 being the (−) input and the source of input transistor M100 being the (+) input. A voltage source Vos is shown between the source of input transistor M100 and $V_{DD}$ to represent a maximum expected value of the inherent input offset voltage of pull-up recovery amplifier 29B. Pull-up recovery amplifier 29B also includes a "designed-in" input offset voltage that exceeds Vos. The gate and drain of input transistor M150 are connected by conductor 60 to a current source 32. The drain of input transistor M100 is connected by conductor 50 to a current source 33. Conductor 50 is the output of pull-down recovery amplifier 29B and is also connected to the gate of pull-down recovery transistor M40. The built-in offset voltage can be "designed in" by providing input transistor M150 with a channel-width-to-channel-length ratio that is N times larger than that of input transistor M100.

In operation, when $V_{16}$ is being driven high to turn on pull-down transistor M2, $V_{out}$ is initially at a high level, well above ground. This causes the voltage on conductor 60 to be higher than $V_{out}$ by an amount equal to the $V_{GS}$ voltage of input transistor M150. This keeps input transistor M100 turned on, causing the voltage on conductor 50 to be close to ground, and thereby keeping pull-down recovery transistor M100 off. $V_{out}$ therefore rapidly falls toward ground as $V_{16}$ continues to increase. However, by the time $V_{out}$ has decreased to within approximately Vos millivolts of ground, the voltage on conductor 60 has decreased enough to substantially reduce the current flowing through input transistor M100. By the time $V_{out}$ has decreased to within Vos volts of ground, the current through current source 33 has increased the voltage on conductor 50 enough to begin to turn pull-down recovery transistor M40 on, and as it is turned on even harder it prevents $V_{16}$ from going any higher and prevents further "saturation" of pull-down transistor M2, and therefore substantially reduces the overload recovery delay time required to discharge the large capacitance associated with conductor 16 to a voltage low enough to turn off the pull down transistor M2, in the event of a sudden increase in the input signal $V_{in}$ applied to differential input stage 13. Since pull-down recovery transistor M40 is completely off until $V_{out}$ has decreased to within Vos millivolts of ground, it does not reduce the open-loop gain of operational amplifier 200 of FIG. 3 until $V_{out}$ has decreased to within Vos millivolts of ground.

Figure 4A:
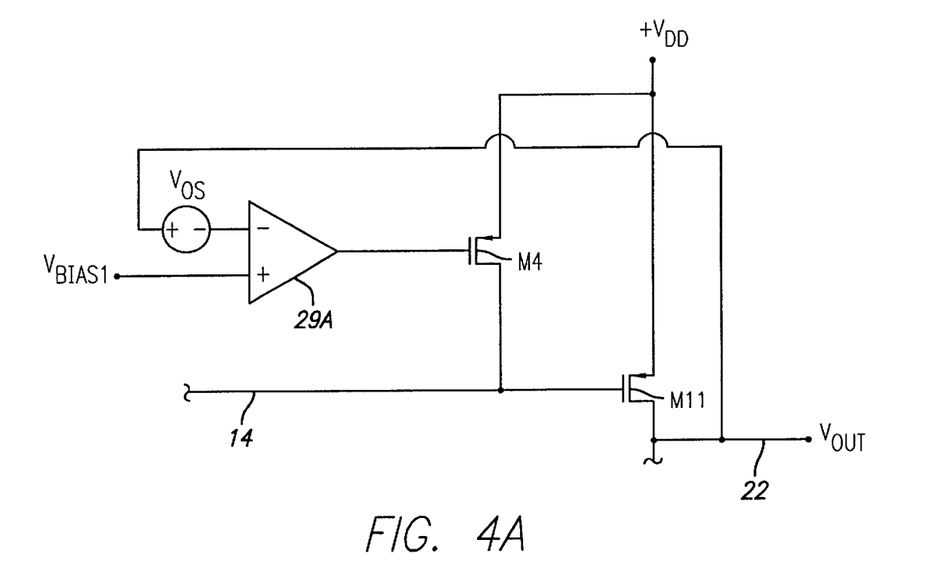
FIG. 4A is a generalized diagram of another recovery circuit of the invention suitable for use with low-voltage transistors.

FIG. 4A illustrates a modified high side overload recovery circuit than that is similar to the one shown in FIG. 1A, except that the source of pull-up recovery transistor M4 is connected to $V_{DD}$ rather than $V_{out}$. The high side overload recovery circuit of FIG. 4A is more suitable if "high-voltage" transistors cannot be manufactured utilizing the desired integrated circuit CMOS manufacturing process. For example, note that in FIG. 2A, if $V_{out}$ is at a relatively low voltage, then the difference between $V_{DD}$ and $V_{out}$ may be quite large, e.g., approximately 10 volts. This large voltage may cause the voltage that may be safely applied between the source and gate and/or between the source and drain of recovery transistor M4 to be exceeded. The large voltage referred to may also cause the voltage that may be safely applied to the source of input transistor M15 to be exceeded. The circuit of FIG. 4A avoids that problem. However, the circuit of FIG. 4A has a much slower frequency response and therefore is substantially less stable than the circuit of FIG. 2A. The pull-up recovery amplifier 29A of FIG. 2A has a very high-speed path from $V_{out}$ to the gate of pull-up recovery transistor M4 because the common gate configuration of input transistors M15 and M10 is inherently very fast, whereas the high side recovery circuit 29C of FIG. 4A would not have the same fast common-gate configuration. Note that in order to avoid the large voltage difference between the sources of M15 and M10, the common-gate amplifier connection would not be used in FIGS. 4A and 4B. Consequently, the high side recovery circuit of FIG. 4A requires substantially more compensation capacitance than the one of FIG. 2A.

Figure 4B:
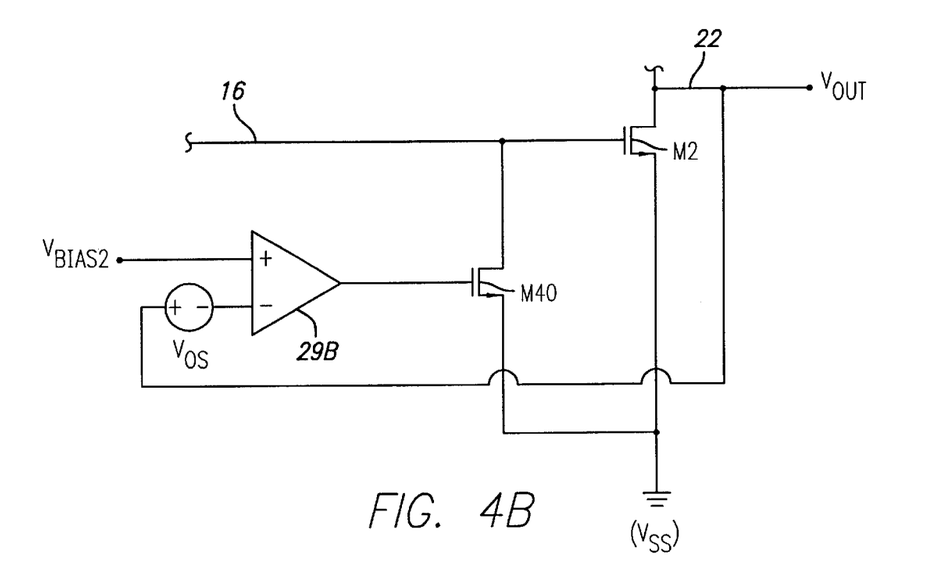
FIG. 4B is a generalized diagram of another recovery circuit of the invention suitable for use with low-voltage transistors.

FIG. 4B illustrates a low side overload recovery circuit that is analogous to the high side overload recovery circuit of FIG. 4A.

Thus, the invention provides fast, stable overload recovery for a high-speed CMOS amplifier, comparator, or operational amplifier by providing fast, stable limitation of the gate voltages of the P-channel pull-up recovery transistor M11 and the N-channel pull-down recovery transistor M2 in response to the output voltage of the operational amplifier. The limitation of the gate voltages occurs only when $v_{out}$ is very close to either the $V_{DD}$ supply voltage or the $V_{SS}$ supply voltage.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, essentially the same circuitry can be used in a bipolar implementation to limit the amount of current flowing into the base of a bipolar output transistor, so as to prevent the output transistor from saturating and reducing the amount of "storage time" and associated circuit delay required for recombination of carriers in the base thereof.

What is claimed is:

1. A differential input circuit comprising:
    (a) an input stage receiving an input signal and having an output terminal;
    (b) an output stage including an output transistor having a source coupled to a supply voltage, a gate coupled to the output terminal, and a drain coupled to an output conductor conducting an output signal; and
    (c) an overload recovery circuit coupled between the output conductor and the gate of the output transistor for limiting the voltage on the gate of the output transistor in response to the output voltage when the output voltage is within a predetermined range of the supply voltage, wherein the overload recovery circuit includes a recovery transistor having a source coupled to the output conductor and a drain coupled to the gate of the output transistor, the overload recovery circuit including a common-gate amplifier having a first input coupled to the output conductor, a second input coupled to the supply voltage, and an output coupled to a gate of the recovery transistor, the common-gate amplifier having a built-in offset voltage that exceeds a predetermined value.

2. A differential input circuit comprising:
    (a) an input stage receiving an input signal and having first and second output terminals;
    (b) an output stage including a pull-up transistor having a source coupled to a first supply voltage, a gate coupled to the first output terminal, and a drain coupled to an output conductor conducting an output signal, and a pull-down transistor having a source coupled to a second supply voltage, a gate coupled to the second output terminal, and a drain coupled to the output conductor; and
    (c) a first overload recovery circuit coupled between the output conductor and the gate of the pull-up transistor for limiting a voltage on the gate of the pull-up transistor in response to the output voltage when the output voltage is within a first predetermined range of the first supply voltage, wherein the first overload recovery circuit includes a pull-up recovery transistor having a source coupled to the output conductor and a drain coupled to the gate of the pull-up transistor, the first overload recovery circuit including a first common-gate amplifier having an inverting input coupled to the output conductor, a non-inverting input coupled to the first supply voltage, and an output coupled to a gate of the pull-up recovery transistor, the first common-gate amplifier having a built-in offset voltage that exceeds a first predetermined value.

3. The differential input circuit of claim 2 wherein the first predetermined value is a maximum expected value of an input offset voltage of the first common-gate amplifier.

4. The differential input circuit of claim 2 wherein the first common-gate amplifier includes a first input transistor having a source coupled to the output conductor and a gate and drain coupled to a first current source and a second input transistor having a source coupled to the first supply voltage, a gate coupled to the gate and drain of the first input transistor, and a drain coupled to a second current source and to a gate of the pull-up recovery transistor.

5. The differential input circuit of claim 4 wherein the pull-up transistor, the pull-up recovery transistor, and the first and second input transistors are P-channel transistors.

6. The differential input circuit of claim 5 wherein the first current source includes a first N-channel current source transistor having a drain coupled to the drain and gate of the first input transistor and a source coupled to the second supply voltage, and the second current source includes a second N-channel current source transistor having a drain coupled to the drain of the second input transistor and a source coupled to the second supply voltage.

7. The differential input circuit of claim 2 including a second overload recovery circuit coupled between the output conductor and the gate of the pull-down transistor for limiting a voltage on the gate of the pull-down transistor in response to the output voltage when the output voltage is within a second predetermined range of the second supply voltage, wherein the second overload recovery circuit includes a pull-down recovery transistor having a source coupled to the output conductor and a drain coupled to the gate of the pull-down transistor, the second overload recovery circuit including a second common-gate amplifier having an inverting input coupled to the output conductor, a non-inverting input coupled to the second supply voltage, and an output coupled to a gate of the pull-down recovery transistor, the second common-gate amplifier having a built-in offset voltage that exceeds a second predetermined value.

8. The differential input circuit of claim 6 including a second overload recovery circuit coupled between the output conductor and the gate of the pull-down transistor for limiting the voltage on the gate of the pull-down transistor in response to the output voltage when the output voltage is within a second predetermined range of the second supply voltage, wherein the second overload recovery circuit includes a pull-down recovery transistor having a source coupled to the output conductor and a drain coupled to the gate of the pull-down transistor, the second overload recovery circuit including a second common-gate amplifier having an inverting input coupled to the output conductor, a non-inverting input coupled to the second supply voltage, and an output coupled to the gate of the pull-down recovery transistor, the second common-gate amplifier having a built-in offset voltage that exceeds a second predetermined value.

9. The differential input circuit of claim 8 wherein the second common-gate amplifier includes a third input transistor having a source coupled to the output conductor and a gate and drain coupled to a third current source and a fourth input transistor having a source coupled to the first supply voltage, a gate coupled to the gate and drain of the third input transistor, and a drain coupled to a fourth current source and to the gate of the pull-down recovery transistor.

10. The differential input circuit of claim 9 wherein the pull-down transistor, the pull-down recovery transistor, and the first and second input transistors are N-channel transistors.

11. The differential input circuit of claim 10 wherein the third current source includes a first P-channel current source transistor having a drain coupled to the drain and gate of the third input transistor and a source coupled to the first supply voltage, and the fourth current source includes a second P-channel current source transistor having a drain coupled to the drain of the fourth input transistor and a source coupled to the first supply voltage.

12. The differential input circuit of claim 10 wherein the first and second predetermined values are substantially equal to maximum expected values of input offset voltages of the first and second common-gate amplifiers, respectively.

13. The differential input circuit of claim 12 wherein the built-in offset voltage of the first common-gate amplifier is determined by a first ratio of a channel-width-to-channel-length ratio of the first input transistor to a channel-width-to-channel-length ratio of the second input transistor.

14. The differential input circuit of claim 13 wherein the first ratio is greater than 1.

15. The differential input circuit of claim 13 wherein the built-in offset voltage of the first common-gate amplifier is also determined by a current ratio of the current supplied by the first current source to the current supplied by the second current source.

16. The differential input circuit of claim 13 wherein the built-in offset voltage of the second common-gate amplifier is determined by a second ratio of a channel-width-to-channel-length ratio of the third input transistor to a channel-width-to-channel-length ratio of the fourth input transistor.

17. The differential input circuit of claim 2 wherein the differential input circuit is a differential amplifier circuit.

18. The differential input circuit of claim 2 wherein the differential input circuit is an operational amplifier circuit.

19. The differential input circuit of claim 2 wherein the differential input circuit is a comparator circuit.

20. A method of operating a differential input circuit including:
(a) applying an input signal to an input stage;
(b) providing an output stage including a pull-up transistor having a source coupled to a first supply voltage, a gate coupled to a first output terminal of the input stage, and a drain coupled to an output conductor conducting an output voltage, and a pull-down transistor having a source coupled to a second supply voltage, a gate coupled to a second output terminal of the input stage, and a drain coupled to the output conductor; and
(c) reducing the amount of time required for the differential input circuit to recover from an overload condition by providing a pull-up recovery transistor having a source coupled to the output conductor and a drain coupled to the gate of the pull-up transistor and by providing an amplifier having an inverting input coupled to the output conductor, a non-inverting input coupled to the first supply voltage, and an output coupled to a gate of the pull-up recovery transistor, the amplifier having a built-in offset voltage that exceeds a predetermined value, in order to limit the voltage on the gate of the pull-up transistor in response to the output voltage when the output voltage is within a predetermined range from the first supply voltage.

21. A method of operating a differential input circuit including:
(a) applying an input signal to an input stage;
(b) providing an output stage including an output transistor having a source coupled to a supply voltage, a gate coupled to an output terminal of the input stage, and a drain coupled to an output conductor conducting an output voltage; and
(c) reducing the amount of time required for the differential input circuit to recover from an overload condition by providing a recovery transistor having a source coupled to the output conductor and a drain coupled to the gate of the output transistor and by providing an amplifier having a first input coupled to the output conductor, a second input coupled to the supply voltage, and an output coupled to a gate of the recovery transistor, the amplifier having a built-in offset voltage that exceeds a predetermined value, in order to limit the voltage on the gate of the output transistor in response to the output voltage when the output voltage is within a predetermined range from the supply voltage.

22. A differential input circuit comprising:
(a) an input stage receiving an input signal and having first and second output terminals;
(b) an output stage including a pull-up transistor having a source coupled to a first supply voltage, a gate coupled to the first output terminal, and a drain coupled to an output conductor conducting an output signal, a pull-down transistor having a source coupled to a second supply voltage, a gate coupled to the second output terminal, and a drain coupled to the output conductor; and
(c) a first overload recovery circuit coupled between the output conductor and the gate of the pull-up transistor for limiting a voltage on the gate of the pull-up transistor in response to the output voltage when the output voltage is within a first predetermined range of the first supply voltage, wherein the first overload recovery circuit includes a pull-up recovery transistor having a source coupled to the first supply voltage and a drain coupled to the gate of the pull-up transistor, the first overload recovery circuit including a first amplifier having an inverting input coupled to the output conductor, a non-inverting input coupled to the first supply voltage, and an output coupled to a gate of the pull-up recovery transistor, the first amplifier having a built-in offset voltage that exceeds a first predetermined value.

23. The differential input circuit of claim 22 including a second overload recovery circuit coupled between the output conductor and the gate of the pull-down transistor for limiting a voltage on the gate of the pull-down transistor in response to the output voltage when the output voltage is within a second predetermined range of the second supply voltage, wherein the second overload recovery circuit includes a pull-down recovery transistor having a source coupled to the second supply voltage and a drain coupled to the gate of the pull-down transistor, the second overload recovery circuit including a second amplifier having an inverting input coupled to the output conductor, a non-inverting input coupled to the second supply voltage, and an output coupled to a gate of the pull-down recovery transistor, the second amplifier having a built-in offset voltage that exceeds a second predetermined value.

24. A differential input circuit comprising:

(a) an input stage receiving an input signal and having an output terminal;

(b) an output stage including an output transistor having a source coupled to a supply voltage, a gate coupled to the output terminal, and a drain coupled to an output conductor conducting an output signal; and (c) an overload recovery circuit coupled between the output conductor and the gate of the output transistor for limiting a voltage on the gate of the output transistor in response to the output voltage when the output voltage is within a predetermined range of the supply voltage, wherein the overload recovery circuit includes a recovery transistor having a source coupled to the supply voltage and a drain coupled to the gate of the output transistor, the overload recovery circuit including an amplifier having a first input coupled to the output conductor, a second input coupled to the supply voltage, and an output coupled to a gate of the recovery transistor, the amplifier having a built-in offset voltage that exceeds a predetermined value.

* * * * *